(12) United States Patent
Lemkin

(10) Patent No.: US 7,791,419 B1
(45) Date of Patent: Sep. 7, 2010

(54) TIMING CALIBRATION FOR CRYSTAL OSCILLATORS WITHIN A MESH NETWORK

(75) Inventor: Mark Lemkin, Berkeley, CA (US)

(73) Assignee: Dust Networks, Inc., Hayward, CA (US)

( * ) Notice: Subject to any disclaimer, the term of this patent is extended or adjusted under 35 U.S.C. 154(b) by 31 days.

(21) Appl. No.: 12/082,242

(22) Filed: Apr. 9, 2008

Related U.S. Application Data

(60) Provisional application No. 60/930,226, filed on May 14, 2007.

(51) Int. Cl.
*H03L 7/24* (2006.01)
*H03L 1/02* (2006.01)

(52) U.S. Cl. .......................... 331/47; 331/44; 331/158; 331/154; 331/176

(58) Field of Classification Search ................ 331/47, 331/55, 158, 176, 44, 175, 74, 14, 1 R
See application file for complete search history.

(56) References Cited

U.S. PATENT DOCUMENTS

| | | | | |
|---|---|---|---|---|
| 4,513,259 A | * | 4/1985 | Frerking | 331/176 |
| 5,525,936 A | * | 6/1996 | Post et al. | 331/47 |
| 5,831,485 A | * | 11/1998 | Nelson et al. | 331/47 |
| 6,020,790 A | * | 2/2000 | Jackson et al. | 331/44 |
| 7,183,868 B1 | * | 2/2007 | Wessendorf | 331/158 |
| 7,391,273 B2 | * | 6/2008 | Seki et al. | 331/47 |

\* cited by examiner

*Primary Examiner*—Robert Pascal
*Assistant Examiner*—Ryan Johnson
(74) *Attorney, Agent, or Firm*—Van Pelt, Yi & James LLP

(57) ABSTRACT

Timing calibrator is disclosed. A first oscillator includes an output. The first oscillator includes a mechanically resonant element. A second oscillator includes an output. The second oscillator includes a quartz resonator. A frequency relater has an output, a first input, and a second input. The frequency relater has the first input coupled to the first oscillator output and the second input coupled to the second oscillator output.

32 Claims, 12 Drawing Sheets

|  |  |  |  |
|---|---|---|---|
| B1 → A1 | A1 → G | A1 → B1 | Ch 0 |
|  | B2 → A2 | A2 → G | Ch 1 |
| A3 → B3 |  | B3 → A3 | Ch 2 |
| S0 | S1 | S2 |  |

|  |  |  |  |
|---|---|---|---|
|  | G → A1, A2, A3 |  | Ch 0 |
| A2 → B2 |  | A2 → B1, B2, B3 | Ch 1 |
| A3 → G |  |  | Ch 2 |
| S3 | S4 | S5 |  |

FIG. 2

TIMING CALIBRATION FOR CRYSTAL OSCILLATORS WITHIN A MESH NETWORK

CROSS REFERENCE TO OTHER APPLICATIONS

This application claims priority to U.S. Provisional Patent Application No. 60/930,226 entitled TIMING CALIBRATION FOR A MESH NETWORK filed May 14, 2007 which is incorporated herein by reference for all purposes.

BACKGROUND OF THE INVENTION

Time division multiple access (TDMA) mesh networks require precision timing to achieve energy efficiency by minimizing the time that a radio receiver needs to be turned on to receive a message in its designated time slot from a transmitter. A guard time is added before and after the start of a designated time slot, during which the radio receiver is turned on, to ensure that a transmission is not missed for the case when a receiving node's time keeping is not synchronized with a transmitting node's time keeping. If both clocks are very accurately synchronized, then this guard time can be minimized or even eliminated. Timekeeping clocks for use in mesh networks often use crystal oscillators in which a quartz crystal is resonated using an oscillation circuit such as a Pierce oscillator or a series oscillator. One approach to maintaining synchronization is to have stringent requirements on time keeping crystals so that the timekeeping clocks are accurate and stable especially for different temperatures. For inexpensive low power time keeping crystals, a receiver and transmitter can achieve the stringent requirements using a multi-point calibration over temperature and adjusting the time keeping crystals or timers driven by the crystals for the effects of temperature using the calibration. However, the measurement of a multi-point calibration over temperature is time consuming for these crystals and can lead to high manufacturing costs. Another approach is to purchase temperature stabilized crystals, such as an oven stabilized crystal oscillator, but these crystals can be either more expensive or use more power.

BRIEF DESCRIPTION OF THE DRAWINGS

Various embodiments of the invention are disclosed in the following detailed description and the accompanying drawings.

FIG. 2 is a block diagram illustrating an embodiment of a superframe corresponding to the digraph network of FIG. 1.

DETAILED DESCRIPTION

Figure 1:
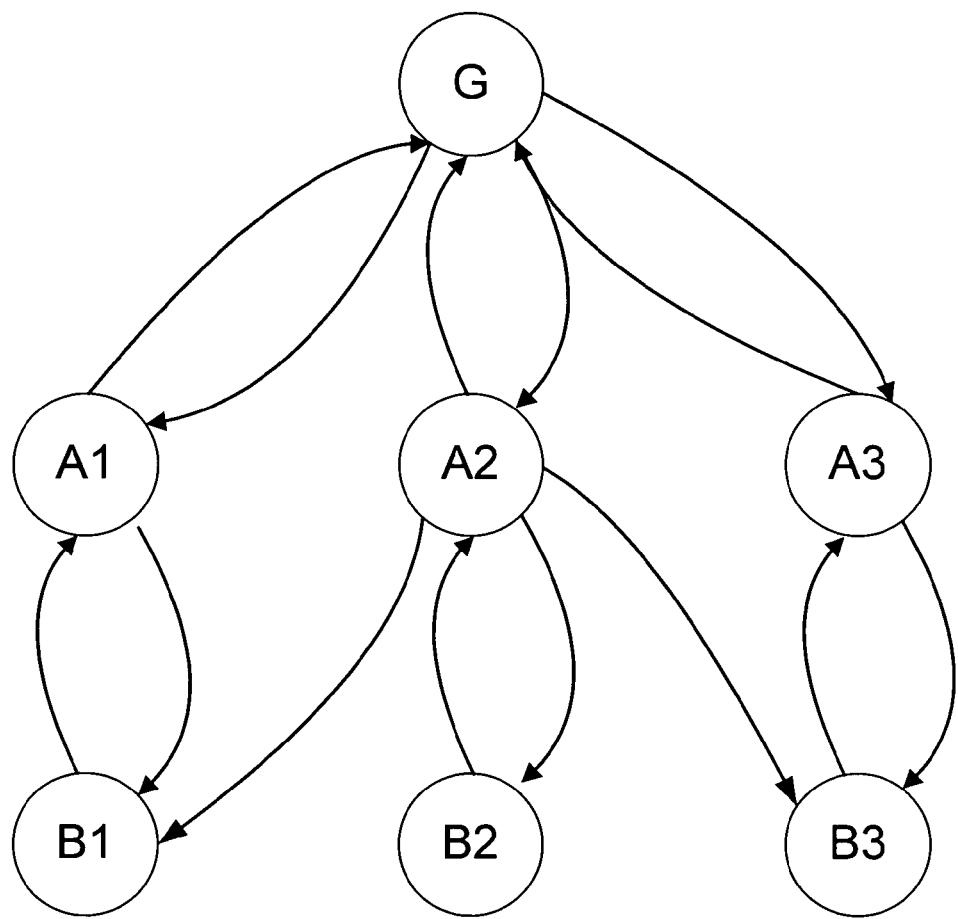
FIG. 1 is a block diagram illustrating an embodiment of a TDMA mesh network.

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Timing calibration for a mesh network is disclosed. A mesh network node includes two oscillators. One oscillator, a node oscillator, remains on all the time to maintain network synchronization and uses very little power so that the node can be powered using a battery. The other oscillator, a radio oscillator, generally turns on only when the radio is operational and is used in for the transmission and reception of messages to other nodes.

In some embodiments, to maintain low power consumption, as well as low cost, the node oscillator includes a watch crystal, or 32 kHz crystal (e.g., with a nominal 32.768 kHz operating frequency) and an oscillation circuit to make, for example, the well-known Pierce oscillator. In some embodiments, the power dissipated by a 32 kHz oscillator is designed to be a fraction of a micro-Watt. However, watch crystals typically do not necessarily have optimal frequency vs. temperature characteristics; in fact, watch crystals often have a frequency change of more than 100 parts per million (ppm) from a nominal frequency over the industrial temperature usage range of −40° C. to 85° C. In various embodiments, a node oscillator comprises a mechanical resonant element, a quartz crystal (e.g., with a resonance between 10 kHz and 100 kHz), a micro-machined silicon resonator, a bulk-acoustic wave resonator, a surface-acoustic wave resonator, or any other appropriate oscillator.

A radio oscillator provides a stable frequency reference for radio frequency (RF) carrier generation; actual RF carrier generation is typically accomplished using a voltage controlled oscillator (VCO) and a phase-locked loop (PLL). The radio oscillator typically operates at a higher frequency than a node oscillator so that the PLL may settle more quickly and so that the PLL may lower close-in phase noise. Due to the physical construction of higher-frequency quartz crystal resonators, radio oscillators typically have a frequency vs. temperature characteristic that is less variable than the node oscillator—for example, +/−25 ppm frequency change over a temperature range. In addition, the part-to-part variation of the radio oscillator change in frequency versus temperature characteristic is often less than the part-to-part variation of the node oscillator change in frequency versus temperature characteristic. In some embodiments, the radio oscillator comprises a quartz resonator with a resonance above 1 MHz. In various embodiments, the radio oscillator comprises a bulk acoustic wave (BAW) or surface acoustic (SAW) resonator, or any other appropriate resonator.

In some embodiments, a single point temperature calibrated radio oscillator is used to calibrate a node oscillator with high accuracy due to the more temperature-stable characteristics of the radio oscillator. In some embodiments, the determination of a particular radio oscillator's frequency (e.g., 20 MHz plus a frequency error in ppm) is accomplished very quickly using automated test equipment, thereby keeping calibration costs very low. Given the temperature-stable characteristics of the radio oscillator, a measurement of the radio oscillator's frequency at a single temperature, for example room temperature, is used for a single point calibration. Using the single-point calibration measurement, a temperature measurement, and a fit of the temperature dependence of a typical radio oscillator, a radio oscillator frequency estimate can be corrected to within an error associated with the variation of the radio oscillator from a typical radio oscillator. In various embodiments, a temperature measurement is made using a proportional-to-absolute-temperature circuit (PTAT), a thermistor, a thermocouple, a $V_{be}$ circuit, or any other appropriate way of measuring temperature.

The temperature calibrated radio oscillator is then used to calibrate the node oscillator. In some embodiments, the node oscillator comprises a 32 kHz watch crystal and the radio oscillator a 20 MHz crystal. In some embodiments, a counter is used to relate the node oscillator's frequency to the radio oscillator's frequency. After the node oscillator's frequency has been measured using the radio oscillator, a correction is made to a clock being run by the node oscillator to achieve a well calibrated clock. The radio oscillator is only required for a short time to perform the calibration and can be shut down to conserve power.

In some embodiments, the correction uses a fit of the change in frequency as a function of temperature or a table. In some embodiments, a node oscillator is only calibrated against a radio oscillator for every 10° C. to 20° C. change that a node experiences. In some embodiments, linear interpolation between calibration points is used to increase the accuracy of the node oscillator. In some embodiments, a general correction factor based upon typical shape of the radio oscillator's behavior is applied with a single point calibration to subtract mean temperature versus frequency behavior.

In some embodiments, a table is constructed at run time as a node oscillator's temperature varies. After a certain temperature change, the frequency of the node oscillator is measured with respect to the radio oscillator and populated into the table along with the present temperature. In some embodiments, an optional correction factor is applied to the measured node oscillator frequency based upon the present temperature and a typical radio oscillator frequency versus temperature curve. This node oscillator frequency estimate is optionally further refined using a single point or two-point calibration (e.g., a first calibration temperature between 20° C. and 30° C. and a second calibration temperature between 70° C. and 100° C.) of the radio oscillator to account for part-to-part variation in the radio oscillator's crystal. Generally, a single point calibration allows a frequency offset to be compensated for; a two-point calibration allows compensation of both a frequency offset as well as a linear deviation from the typical shape of the radio oscillator frequency vs. temperature curve. In some embodiments, more than two calibration points are used. Once a table entry has been populated, it is reused for compensation of the node oscillator as long as the node oscillator stays at the present temperature as well as the next time the node oscillator is near the present temperature. Adjacent table entries are used along with interpolation and a measurement of the present temperature to provide for improved compensation between table entries.

In various embodiments, the temperature change under which the node oscillator is calibrated is larger, for example every 10° C. change at temperatures close to 25° C., than at temperatures near an operating limit, for example every 2° C. change at −35° C.; the temperature change under which the node oscillator is calibrated is constant over the entire temperature range, or any other appropriate temperature change(s) under which the node is calibrated.

In some embodiments, a radio oscillation of a node is tested at two or more temperatures, and the frequency is measured at each of these temperatures, and a least-squares fit using multiple samples of radio oscillators over several temperatures is applied to a polynomial basis function to characterize the typical frequency versus temperature behavior. In some embodiments, the coefficients to the polynomial basis function are stored so that the function can be recalculated at a calibration time using the coefficients and polynomial basis function.

In some embodiments, determining the radio oscillator frequency is accomplished very quickly using automated test equipment keeping costs low. For example:

Setting a node transmitter or receiver to transmit or receive at a particular frequency and measuring the actual transmitter frequency or local oscillator (LO) feedthrough from the expected frequency. Since the phase lock loop (PLL) relates the radio oscillator frequency to the voltage controlled oscillator (VCO), the transmitter frequency is a highly accurate proxy for the radio oscillator frequency, and small variations, which are measured in the parts per million, are rapidly measured using, for example, a spectrum analyzer, frequency counter, or equivalent test equipment.

Setting a node in receive mode and having a tester send packets at a known frequency to the receiver. The frequency is measured by looking at the intermediate frequency (IF) as compared to what is expected. For example, a node receiver has a RF input frequency of 2.40 GHz and an IF of +2.5 MHz, where the local receive oscillator is tuned 2.5 MHz below the channel center; therefore if the average IF frequency during packet reception is 2.49 MHz you know that the radio oscillator on the node is running approximately 4 parts per million fast.

In some embodiments, relative frequency offset between node radio oscillators is determined in a network during normal operation by comparing the IF of packets received with what is expected. For example, a node has a nominal RF of 2.4

GHz and a nominal IF of +2.5 MHz; therefore, if the average IF frequency during packet reception is 2.49 MHz, then the radio oscillator at the node that transmitted the packet is 4 ppm slow as compared to the node that received the packet. In this manner, frequency calibration is propagated by an adaptive or non-adaptive algorithm through the network from, for example, a gateway. In some embodiments, the relative frequency between two nodes is used to adjust the relative frequencies of the time bases of nodes locally, without a common time base from a manager or gateway.

In some embodiments, because a radio oscillator is operated at a low duty cycle, the change due to aging of the radio oscillator is less than the node oscillator depending on the particular crystals used. Calibration of the node oscillator using the radio oscillator removes the changes due to aging for the node oscillator (e.g., a 32 KHz watch crystal).

In some embodiments, the radio oscillator includes a quartz resonator that is AT or SC cut and the node oscillator includes a quartz resonator tuning fork. Quartz tuning fork resonators often have a non-zero hysteresis in the frequency versus temperature characteristic. Hysteresis in the frequency versus temperature characteristic is also known as thermal retrace. Thermal retrace prevents a one-to-one mapping between node oscillator temperature and node oscillator frequency, since the node oscillator frequency depends on the temperature profile used to arrive at the node temperature (e.g., from a higher or lower temperature). Quartz resonators of AT- and SC-cuts generally have low thermal retrace. Calibration of the node oscillator during and after temperature changes using the radio oscillator removes the effect of node oscillator thermal retrace because the node oscillator frequency is measured directly using a low-retrace reference (i.e., a radio oscillator).

FIG. 1 is a block diagram illustrating an embodiment of a TDMA mesh network. In the example shown, nodes of a TDMA mesh network are connected to each other with directional communication links. The links indicate the direction of transmission of data packets. In some embodiments, there is communication in the opposite direction of the link in order to acknowledge, or not acknowledge, the proper receipt of a data packet after it has been transmitted. Gateway node G is linked to node A1, node A2, and node A3. Node A1 is linked to node G and to node B1. Node A2 is linked to node G, node B1, node B2, and node B3. Node A3 is linked to node G and node B3. Node B1 is linked to node A1. Node B2 is linked to node A2. Node B3 is linked to node A3.

FIG. 2 is a block diagram illustrating an embodiment of a superframe corresponding to the digraph network of FIG. 1. In the example shown, a superframe containing three channels is shown: channel 0 (Ch 0), channel 1 (Ch 1), and channel 2 (Ch 2). In various embodiments, there is/are one, two, four, or any other number of channels used for communicating between nodes. In various embodiments, a channel corresponds to a single consistent frequency being used for communication, a rotating or pseudo-randomly assigned frequency being used for communication, or multiple simultaneous frequencies being used for communication, or any other appropriate correspondence for a channel to be used for communication. In some embodiments, the channels are in the 900-930 MHz or 2.45 GHz industrial, scientific, and medical (ISM) radio band. The superframe also contains six time slots: slot 0 (S0), slot 1 (S1), slot 2 (S2), slot 3 (S3), slot 4 (S4), and slot 5 (S5). In the example illustrated in FIG. 2, in Ch 0-S0 cell, node B1 sends to node A1. In Ch 2-S0 cell, node A3 sends to node B3. In Ch 0-S1 cell, node A1 sends to node G. In Ch 1-S1 cell, node B2 sends to node A2. In Ch 0-S2 cell, node A1 sends to node B1. In Ch 1-S2 cell, node A2 sends to node G. In Ch 2-S2 cell, node B3 sends to node A3. In Ch 1-S3 cell, node A2 sends to node B2. In Ch 2-S3 cell, node A3 sends to node G. In Ch 0-S4 cell, node G sends to nodes A1, A2, and A3. In Ch 1-S5 cell, node A2 sends to nodes B1, B2, and B3.

Figure 3A:
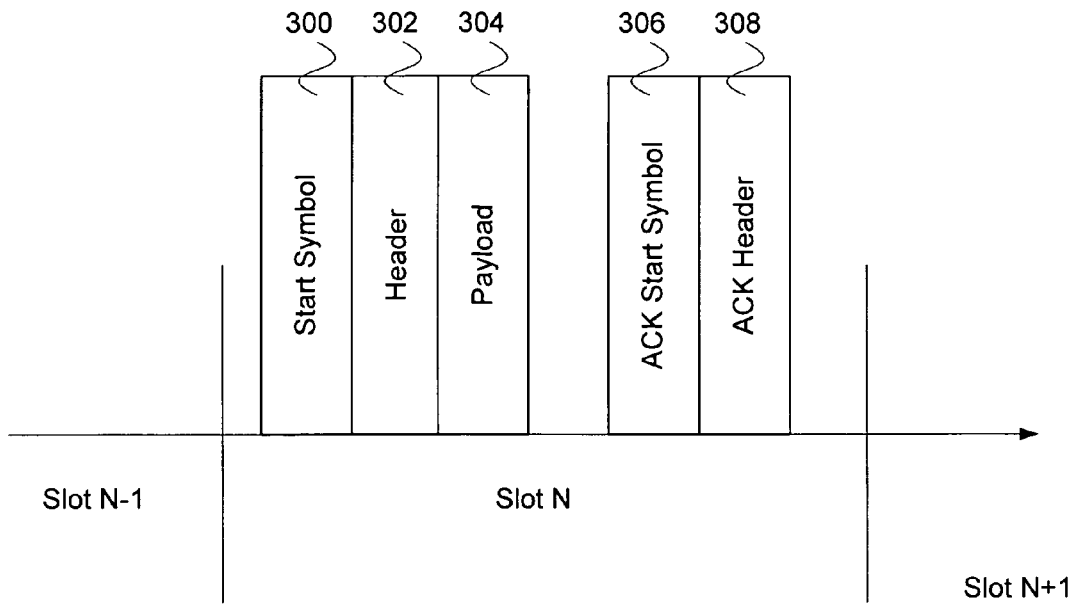
FIG. 3A is a block diagram illustrating an embodiment of communication within a TDMA time slot.

FIG. 3A is a block diagram illustrating an embodiment of communication within a TDMA time slot. In the example shown, within the time slot N, there are potentially two communications on a given channel. The first communication is for transmitting the packet of information from a first node to a second node. The second communication, if any, is for acknowledging the receipt of the packet at its destination from the second node back to the first node. The transmission packet includes start symbol 300, header 302, and payload 304. The acknowledgement packet includes start symbol 306 and header 308. In some embodiments, the acknowledgement packet also contains a payload. In some embodiments, start symbol 300 is used for exchanging timing information. In some embodiments, start symbol 306 is used for exchanging timing information. In some embodiments, the exact time offset of the time of arrival of start symbol 300 is used for determining timing information. In some embodiments, the exact time offset of the time of arrival of start symbol 306 is used for determining timing information. In various embodiments, header 302, header 308, or payload 304 is/are used for exchanging timing information, or any other appropriate portion of communication packet(s). For example, referring to the example as shown in FIG. 2, timing information can be exchanged between node B1 and node A1 in the Ch 0-S0 cell of the superframe. Timing information can be also exchanged between node A1 and node G in the Ch 0-S1 cell of the superframe. A timing slot N−1 precedes time slot N, and a time slot N+1 follows time slot N.

Figure 3B:
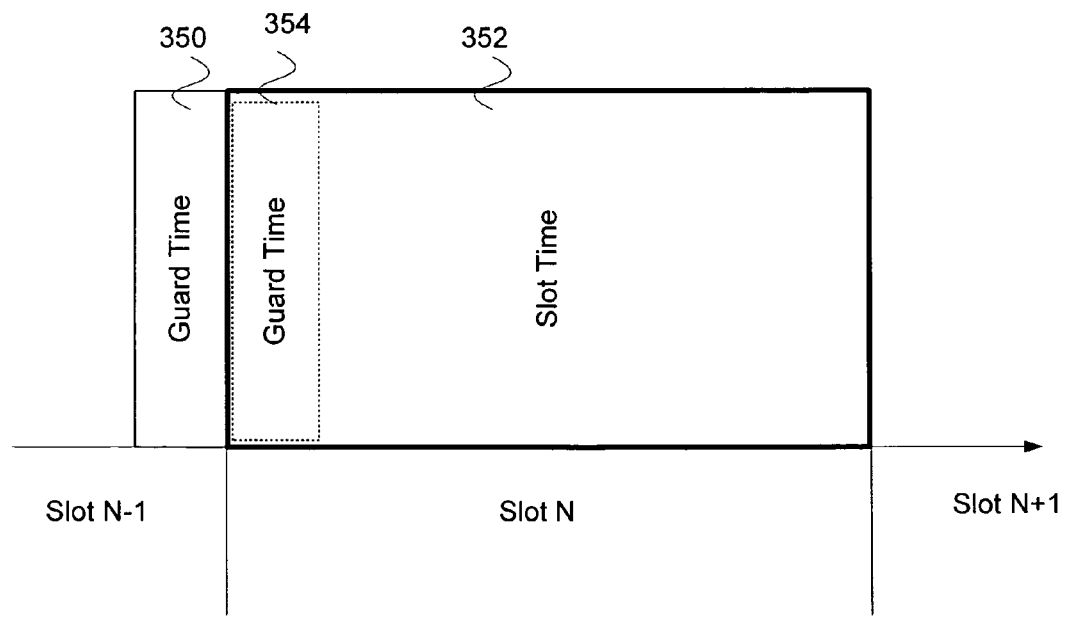
FIG. 3B is a block diagram illustrating an embodiment of radio reception time.

FIG. 3B is a block diagram illustrating an embodiment of radio reception time. In the example shown, a node transmitting to another node in a designated time slot will transmit its packet during slot N in time slot 352 (e.g., a packet as in FIG. 3A). A node receiving a communication from another node will turn on its radio for reception during the designated slot N for time slot 352. Also, because of potential drift in the time keeping on the transmitter and/or receiver, the receiver must listen for a start symbol for a period before and after time slot 352 begins. These periods are indicated as guard times 350 and 354. The greater the potential wander between a receiver's and a transmitter's clock, the larger the guard times should be in order to ensure that a packet transmission in the TDMA slot will be received, and, if appropriate, sent on.

Figure 4:
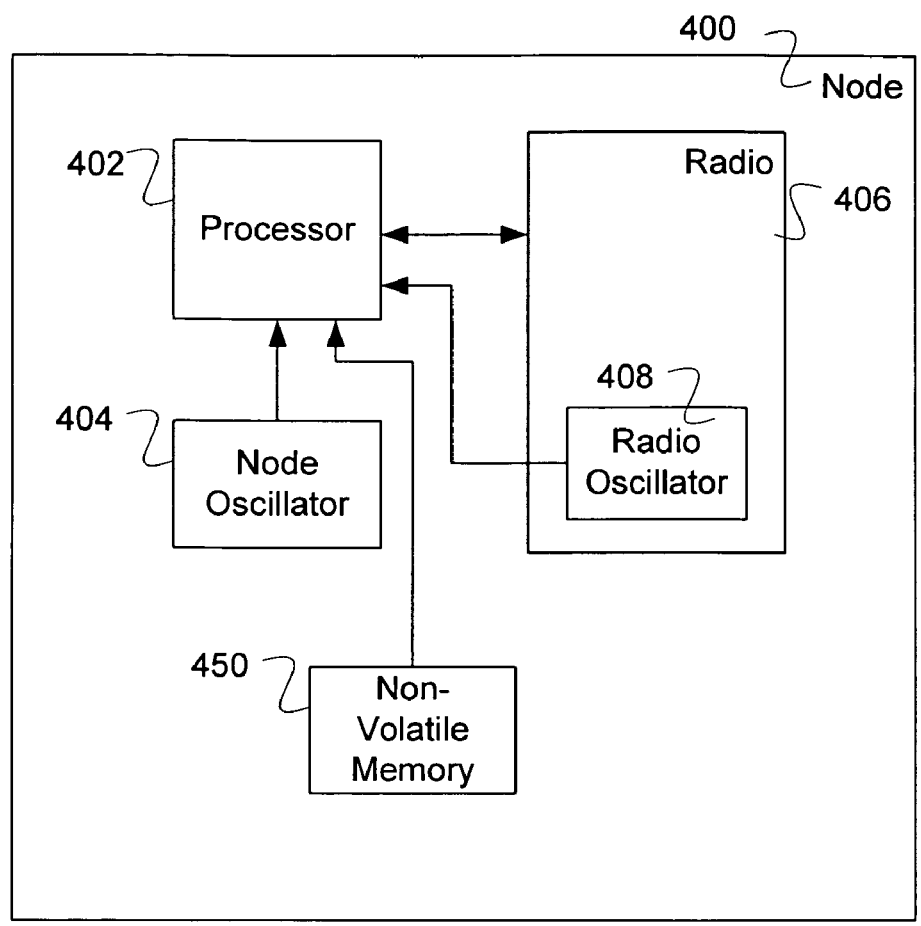
FIG. 4 is a block diagram illustrating an embodiment of a TDMA mesh network node.

FIG. 4 is a block diagram illustrating an embodiment of a TDMA mesh network node. In the example shown, node 400 includes processor 402, node oscillator 404, radio 406 that includes radio oscillator 408, and non-volatile memory 450. Node 400 is able to communicate with other nodes using radio 406. Radio 406 uses radio oscillator 408 as a reference in generating its transmission and for demodulation of a received radio signal. In some embodiments, radio oscillator 408 is a 20 MHz crystal oscillator. Node oscillator 404 is used to maintain time for the network node that is used when communicating with other nodes in the network. In some embodiments, node oscillator 404 is a 32 kHz watch crystal oscillator circuit. Processor 402 is used for controlling node 400 and the communications between nodes. Radio oscillator 408 is able to output its clock signal to processor 402 to enable calibration of node oscillator 400. Non-volatile memory 450 stores the results of a radio oscillator calibration or a frequency versus temperature characteristic of a typical radio oscillator node. In various embodiments, non-volatile memory 450 comprises a FLASH memory, an EEPROM memory, a EPROM memory, a ROM memory, a one-time-programmable memory such as a fuse or antifuse memory, a ferroelectric memory, a ferromagnetic memory, a disk drive or any other appropriate device for storing data in a non-volatile manner. In some embodiments, node 400 does not include non-volatile memory 450.

Figure 5:
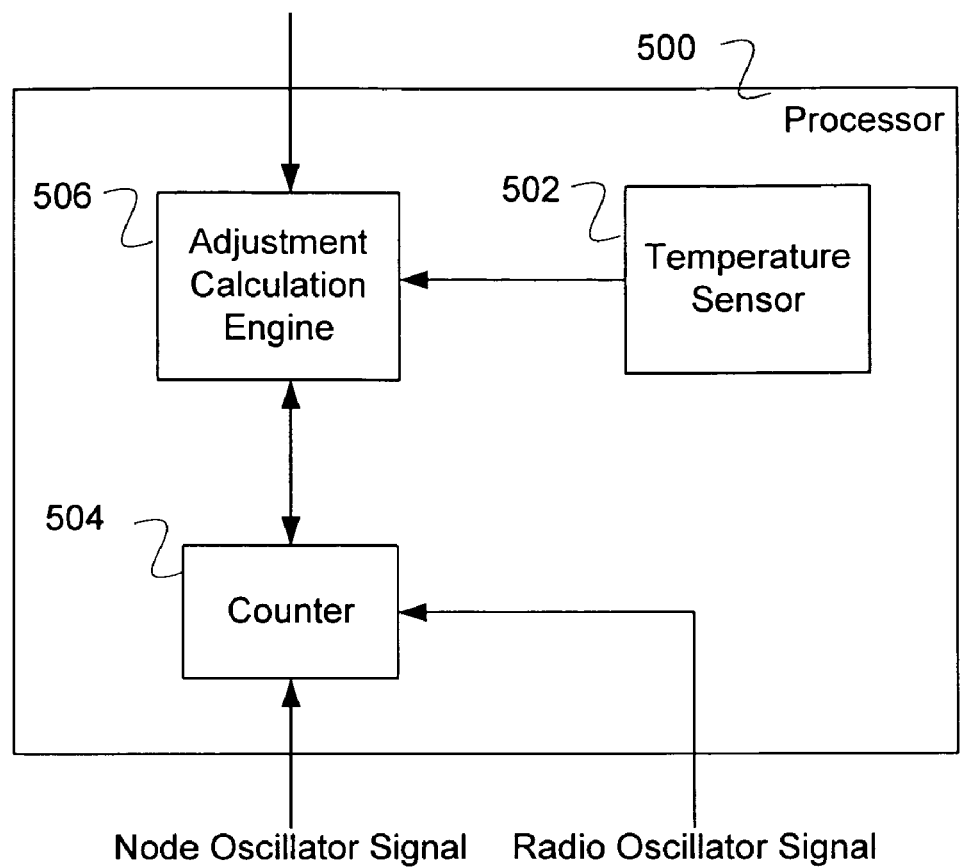
FIG. 5 is a block diagram illustrating an embodiment of a processor for a node.

FIG. 5 is a block diagram illustrating an embodiment of a processor for a node. In the example shown, processor 500 includes temperature sensor 502, adjustment calculation engine 506, and counter 504. Counter 504 receives signal inputs from a node oscillator and a radio oscillator. In various embodiments, counter 504 is used to relate the relative rates of the two oscillator inputs by, for example, for N cycles of the node oscillator counting the number of radio oscillator cycles that occur, for M cycles of the radio oscillator counting the number of node oscillator cycles that occur, or any other way of using counter 504 to relate the two oscillators. Counter 504 information and temperature sensor 502 information can be used by adjustment calculation engine 506 to determine a calibration factor for the node oscillator. For example, the temperature as measured using temperature sensor 502 is used to determine the expected frequency of the radio oscillator. The expected radio oscillator frequency is determined using the temperature, calibration information, and typical performance as a function of temperature as established by a model or table of values. Using the expected radio oscillator frequency and relating the counter value to the number of cycles (e.g., N) of the node oscillator determines a measure of the node oscillator frequency. This measure can be then used to determine an adjustment.

In some embodiments, the adjustment is used to directly compensate the node oscillator so that it oscillates at a desired frequency (e.g., 32.768 kHz) by varying a binary-weighted load capacitance associated with the node oscillator. In some embodiments, the output of such a directly-compensated node oscillator is connected to a timer counter that counts cycles from the node oscillator to provide timing information necessary for the mesh network. In some embodiments, the adjustment is used to add or subtract counts, or to add no count, from a timer counter that counts cycles from the node oscillator to provide timing information necessary for the mesh network. In some embodiments, the addition or subtraction of the counts occurs periodically.

Figure 6:
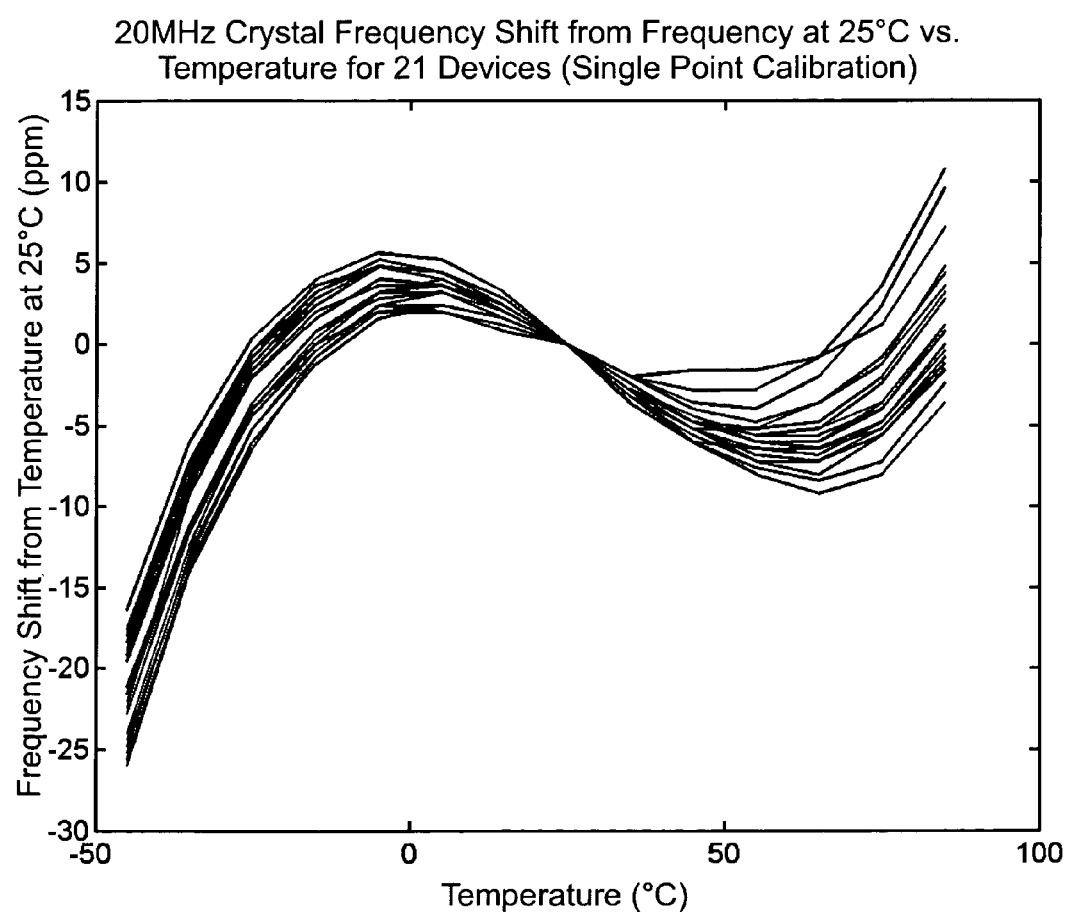
FIG. 6 is a graph illustrating frequency shift for crystals with a single point 25° C. calibration as a function of temperature in one embodiment.

FIG. 6 is a graph illustrating frequency shift for crystals with a single point 25° C. calibration as a function of temperature in one embodiment. In the example shown, a number of 20 MHz crystal oscillator frequency shifts as a function of temperature are shown where the oscillators have been corrected using a single 25° C. measured calibration. Note that the crystal behaviors are within the +10 to −25 ppm over the −45° C. to +85° C. temperature range.

Figure 7:
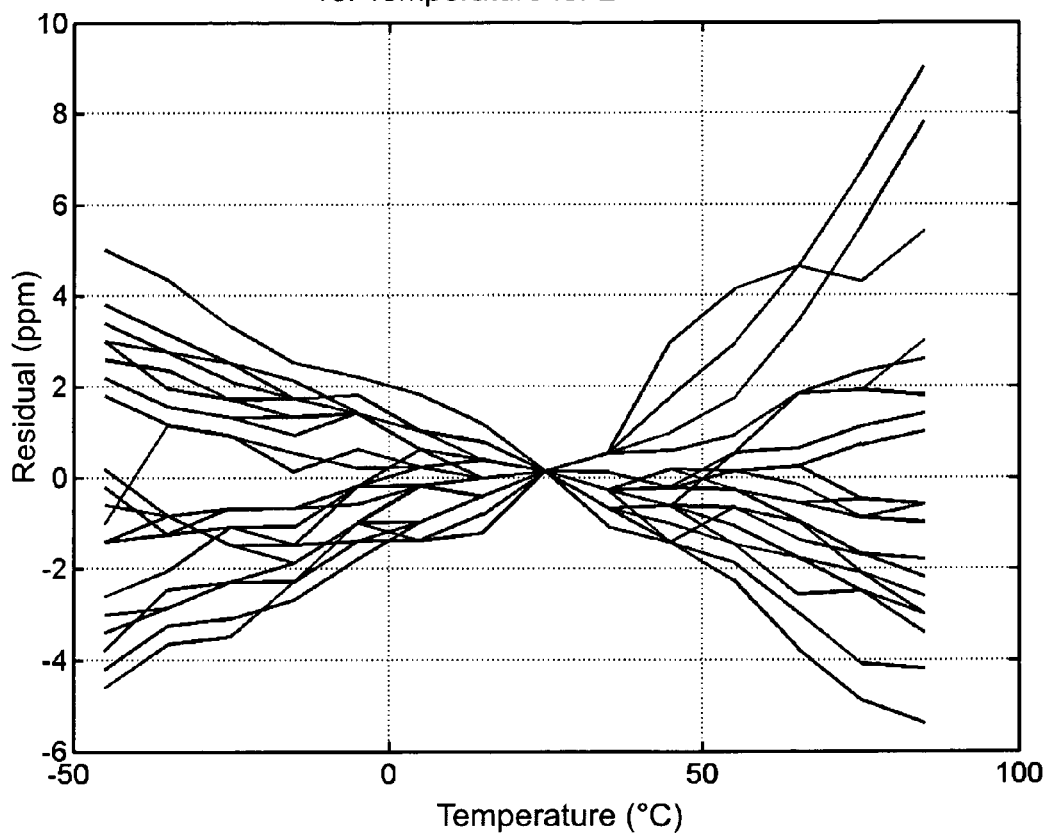
FIG. 7 is a graph illustrating an embodiment of a frequency shift for crystals with a single point 25° C. calibration and a removal of a best fit model of the temperature behavior.

FIG. 7 is a graph illustrating an embodiment of a frequency shift for crystals with a single point 25° C. calibration and a removal of a best fit model of the temperature behavior. In the example shown, the 20 MHz crystal oscillator frequency shift is plotted as function of temperature after a least square's fit third order polynomial is removed. Note that in this example, the frequency shift is between −6 and +10 ppm over the −45° C. to +85° C. temperature range. In various embodiments, a frequency-versus-temperature characteristic of a typical radio oscillator is represented as a table of frequency and temperature values, a table of frequency error and temperature values, coefficients of a polynomial equation, a table of reciprocal frequency and temperature values, a table of reciprocal frequency error values and temperature values, or any other appropriate of representing the frequency-versus-temperature characteristic of an oscillator.

Figure 8:
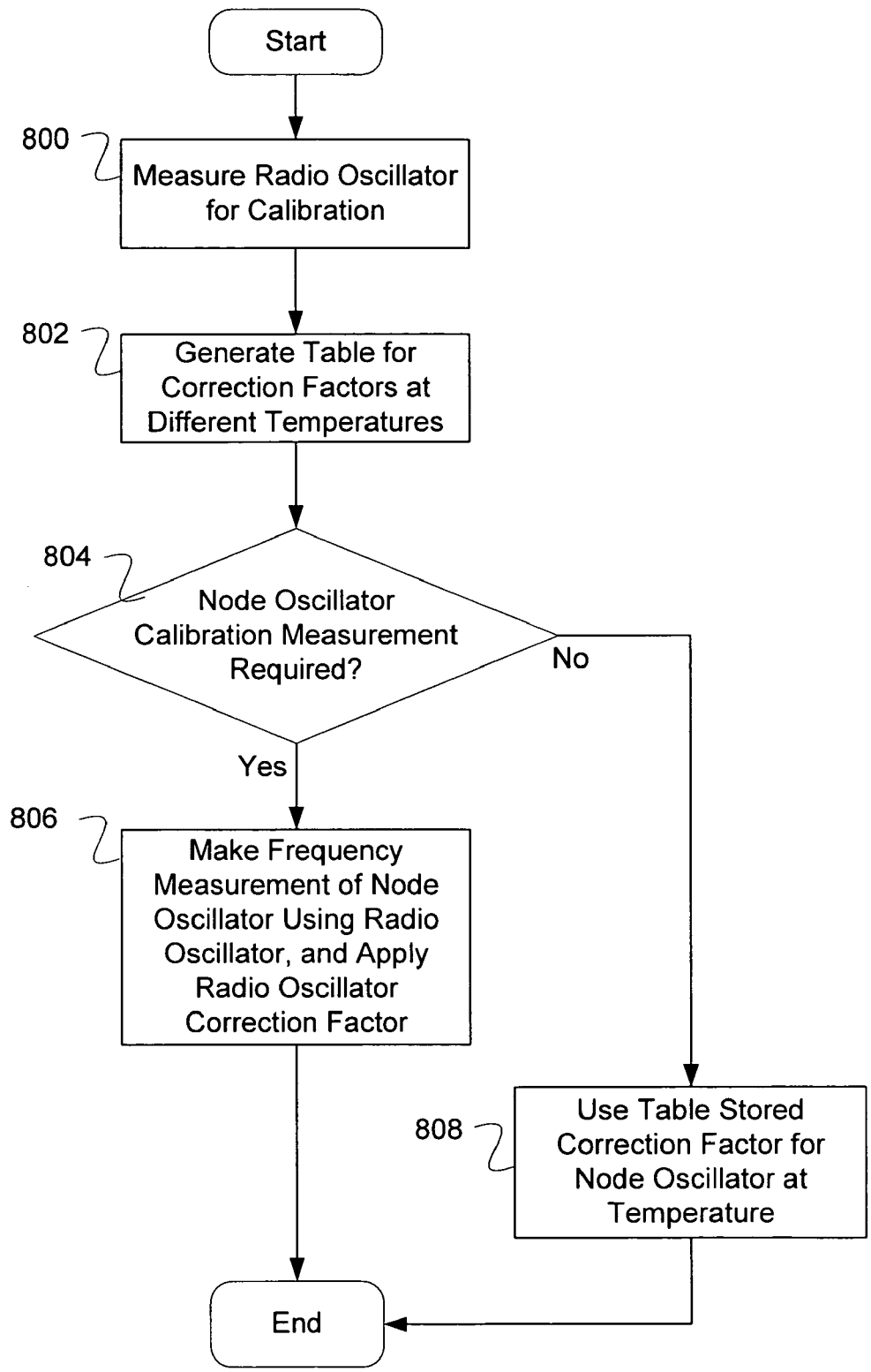
FIG. 8 is a flow diagram illustrating an embodiment of a process for calibrating a node oscillator.

FIG. 8 is a flow diagram illustrating an embodiment of a process for calibrating a node oscillator. In the example shown, in 800 a radio oscillator is measured for calibration. In some embodiments, the radio oscillator is measured using automated test equipment. In some embodiments, the measurement for calibration is performed at manufacturing time for the node. In various embodiments, the results for the radio oscillator calibration are stored as a table, as a polynomial fit, as corrections for a typical polynomial fit, as a typical table (e.g., coefficients for the polynomial factors or a calculation), or in any other appropriate way of storing results for the calibration. In various embodiments, the radio oscillator calibration uses a single point, a two point, or any other appropriate number of points for calibration. In various embodiments, the results for the radio oscillator calibration are stored in a nonvolatile memory (e.g., non-volatile memory 450 of FIG. 4). In 802, a table is generated for correction factors for the node oscillator (e.g., a 32 kHz watch crystal). Each entry in the table is used at a particular temperature to correct the crystal. In various embodiments, the table is updated if no entry is available for the current temperature, at boot up, if a predetermined period of time has elapsed since the last measurement, or any other appropriate update time. In 804, it is determined if a node oscillator calibration measurement is required. In various embodiments, node oscillator calibration measurement or table entry updating is required instead of or on top of calibration using a stored table value, or any other appropriate calibration methodology. If calibration measurement is required, in 806 a frequency measurement of a node is performed using a radio oscillator, and the radio oscillator correction factor is applied. If a calibration measurement is not required, then the stored table correction factor is used for the node oscillator at the current temperature.

In some embodiments, the node oscillator calibration measurement table is loaded as follows: set up a table of ΔT from −40° C. to 85° C. where ΔT is the change in temperature over which there is a 10 ppm shift for a typical node oscillator. On first boot, a node oscillator calibration point is taken and the temperature is recorded. This is stored in the array as a pair (temperature, ppm shift). After a shift in temperature of at least ΔT (e.g., 4° C. at −40° C. gives 10 ppm), pick the closest ΔT from table. At this point, a node oscillator calibration is performed and the temperature is noted. This is repeated for the other data points. To calculate the PPM shift with a data point on either side, linear interpolation is used between the two temperatures on either side. If an excursion is made to a temperature with two points on one side but zero on the other, the two points can be used to extrapolate to the present temperature. If there is only one point in the array (e.g., at boot time), but an excursion of ΔT has not yet been seen, extrapolation is used with a typical slope value until a second point is acquired. In some embodiments, the typical slope value is calculated from ΔT, so there is no need to store extra data. In some embodiments, an extra sample at half the temp range perturbation (e.g., ΔT of 5 ppm) is acquired for this initial startup sequence. A binary search is used to rapidly search for the appropriate array entry.

In some embodiments, the array is expressed in terms of regular PPM intervals or regular temperature intervals using interpolation. In some embodiments, a separate array entry for each degree or two degrees Celsius eliminates the need for interpolation when running.

In some embodiments, a calibration is taken at boot-up at the temperature at boot-up and stored in the array. At the time point #2 is stored, all points are be filled in between point #1 and point #2 via linear interpolation. Extrapolation is further used in the same manner as described above when there is only one point or there are points on only one side of the desired entry.

In some embodiments, a few points are added to the end of the calibration table to cover a bit beyond the useful operating range. This enables the system not to fail suddenly at the ends of the temperature range.

In some embodiments, compensation for thermal time constants is possible. Since the temperature measured at the temperature sensor won't be the exact same temperature of the node oscillator or the radio oscillator during rapid temperature ramps, an error will be present. Characterization of the thermal characteristics of the package is possible and, using this characterization, an estimate for true node and radio oscillator temperatures is possible based upon a dynamic model of the package—for example, a state-space model using lumped thermal-mass and thermal resistance. In the case that the node and the radio oscillators are placed close together or integrated into the same package, such as is possible using system-in-package technology, the difference in temperature across the temperature sensor, radio, and node oscillators is very small.

In some embodiments, the node oscillator is compensated using the radio oscillator without using a measurement of temperature. This is beneficial, for example, when the timing requirements are relaxed or the operating temperature is known to always be over a small range.

In some embodiments, the node oscillator is compensated using the radio oscillator with a measurement of temperature in combination with a typical frequency versus temperature curve. This is beneficial, for example, when the radio oscillator crystal is not connected to radio oscillator circuit at the time of manufacture.

Figure 9A:
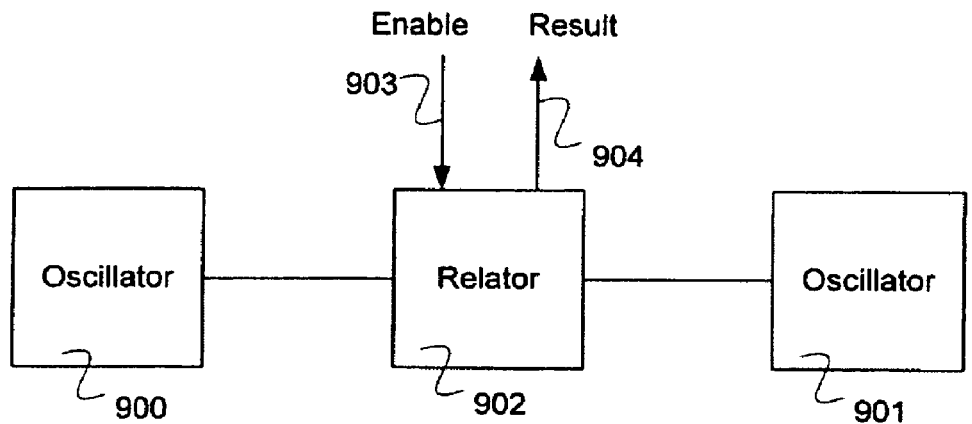
FIG. 9 is a block diagram illustrating an embodiment of a system for timing calibration.

FIG. 9A is a block diagram illustrating an embodiment of a system for timing calibration. In the example shown, oscillator 900 is related to oscillator 901 using relater 902. Relater 902 has enable input 903 and result output 904. In various embodiments, relater 902 includes 1) a counter used to relate the relative rates of oscillator 900 and oscillator 901 by—for example, for X cycles of oscillator 900 count the number of oscillator 901 cycles that occur; 2) a counter used to relate the relative rates of oscillator 900 and oscillator 901 by—for example, for Y cycles of oscillator 901 count the number of oscillator 900 cycles that occur; 3) a VCO and a PLL locked to oscillator 900, where a counter is used to relate the relative rates of oscillator 900 and oscillator 901 by—for example, for Z cycles of oscillator 901 count the number of VCO cycles that occur; the relater includes a charge pump connected to oscillator 901 that sources charge once every P cycles, a charge pump connected to oscillator 900 that sinks charge once every Q cycles, a transresistance amplifier connected to the two charge pump outputs to measure the difference in charge, and an analog to digital converter connected to the output of the transresistance amplifier, or any other appropriate configuration for relater 902. Enable input 903 enables a frequency relation operation to commence. After the frequency of the two oscillators has been related the relationship between the two oscillators is output at result output 904. Result output 904 is used to adjust a timer or a node oscillator frequency.

Figure 9B:
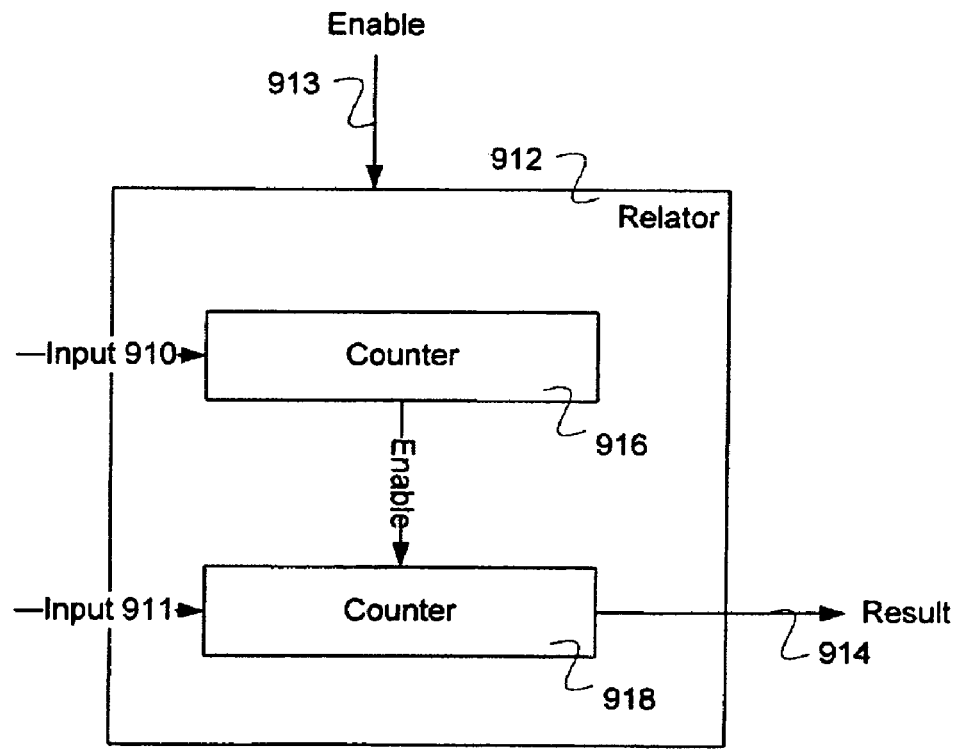

FIG. 9B is a block diagram illustrating an embodiment of a relater. In some embodiments, the relater of FIG. 9B is used to implement 902 of FIG. 9. In the example shown, relater 912 includes two counters: counter 916 and counter 918. Counter 916 counts XX cycles of an oscillator input on input 910 and presents an internal enable signal indicating it is in the process of counting XX cycles of oscillator. The internal enable signal changes state when counter 916 is done counting. Counter 918 counts the number of cycles of an oscillator input on input 911 as long as the internal enable signal from counter 916 indicates counter 916 is still counting. Relator 912 has enable 913 as input and provides result 914 as output.

Figure 10:
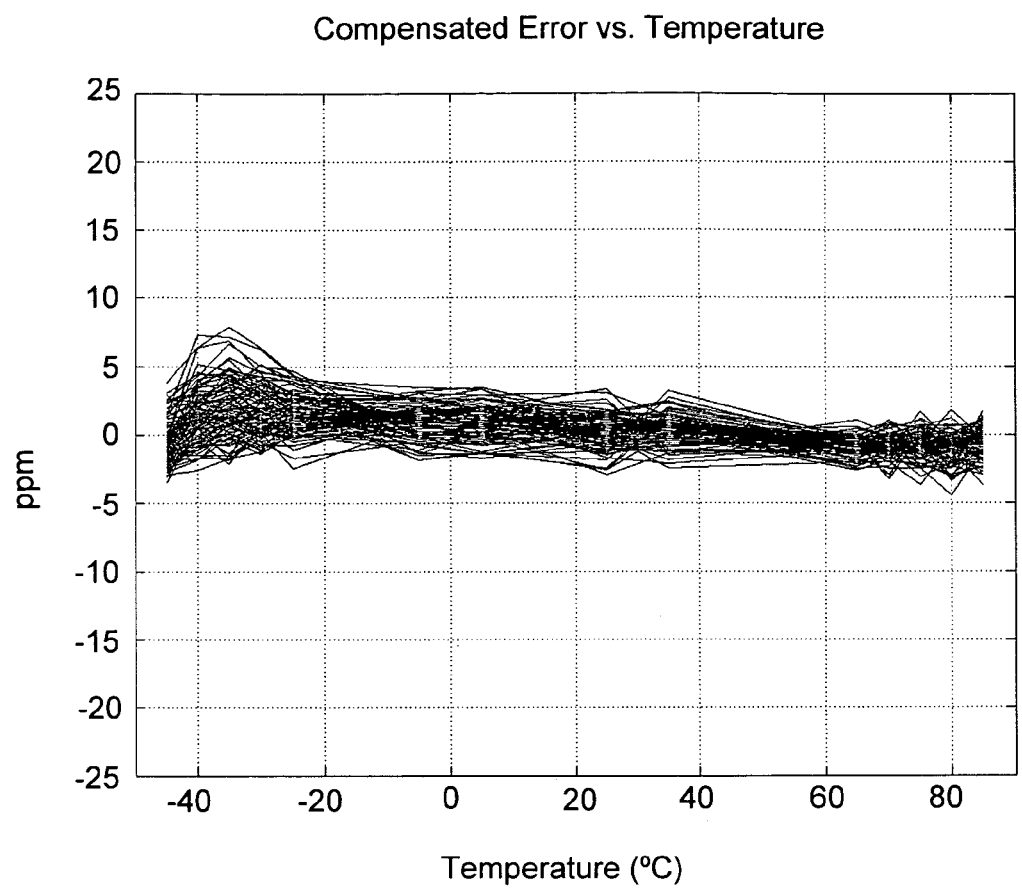
FIG. 10 is a graph illustrating a measured, compensated, node timing error versus temperature for a large number of parts in one embodiment.

FIG. 10 is a graph illustrating a measured, compensated, node timing error versus temperature for a large number of parts in one embodiment. In the example shown, the graph shows the compensated node timing error in ppm for temperatures ranging from approximately −45° C. to 85° C. The ppm error is predominantly within the +5 and −5 ppm range. The high degree of accuracy over temperature is attained by using a two point calibration.

Figure 11:
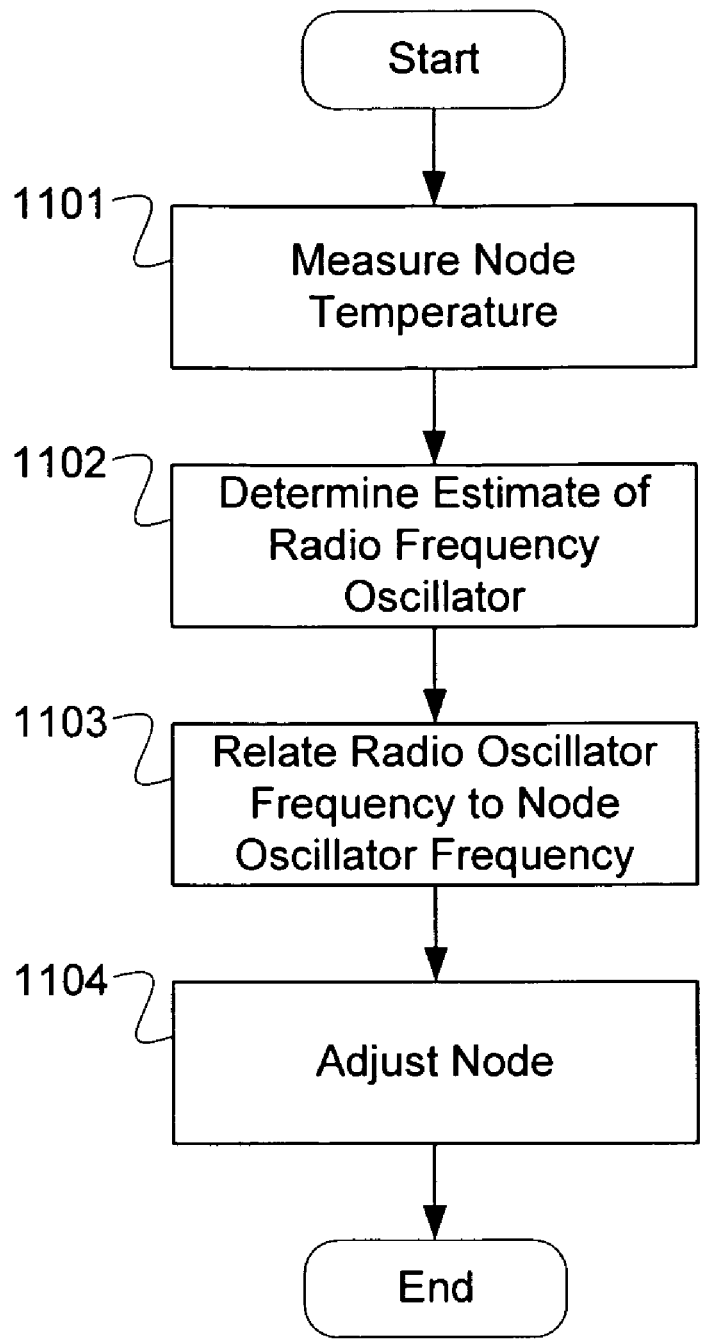
FIG. 11 is a flow diagram illustrating an embodiment of a process for calibrating a node.

FIG. 11 is a flow diagram illustrating an embodiment of a process for calibrating a node. In the example shown, in 1101 the node temperature is measured. In 1102, an estimate of the radio oscillator frequency is determined. The estimate is determined using, for example, a table or polynomial fit of a typical radio oscillator characteristic frequency versus temperature curve with optional correction for unit to unit variations using one or more frequency-at-temperature calibration points. In 1103, the radio oscillator frequency is related to the node oscillator frequency. For example, the radio oscillator frequency is related to the node oscillator frequency using a counter. In 1104, the node is adjusted. The node is adjusted using the relationship between the node and radio oscillators in combination with the radio oscillator frequency estimate. In various embodiments, adjustment of the node is accomplished by adjusting the node oscillator frequency to bring it to a desired value; the node is adjusted by periodically adding or subtracting counts from a timer; or any other appropriate way to adjust the node. The precise order as depicted in the flow diagram of FIG. 11 is not critical; for example, in some embodiments, the radio and node oscillator frequencies are related before measuring the node temperature.

Figure 12:
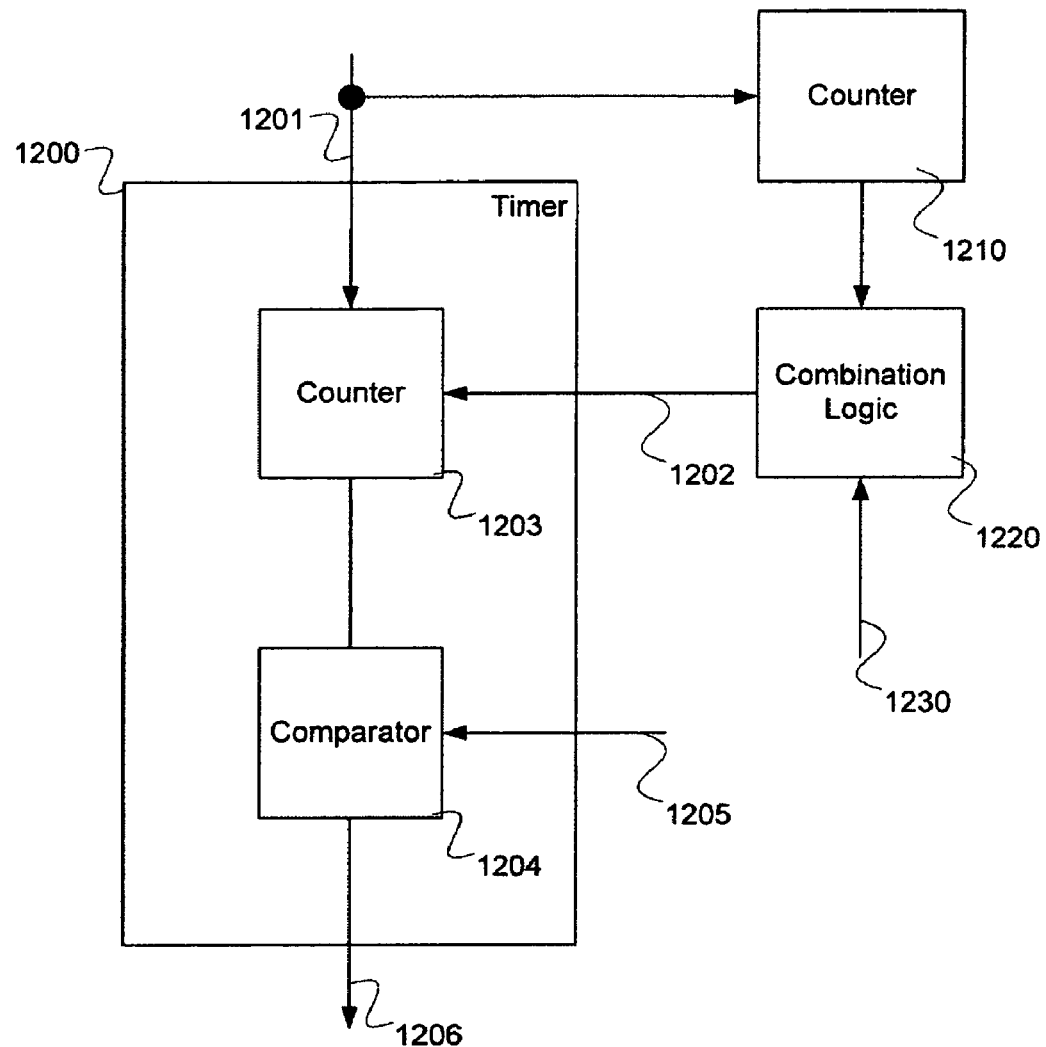
FIG. 12 is a block diagram illustrating an embodiment of a timer.

FIG. 12 is a block diagram illustrating an embodiment of a timer. In the example shown, timer 1200 includes input 1201, compensation input 1202, counter 1203, comparator 1204, comparator input 1205, and event output 1206. Input 1201 is coupled to the uncompensated node oscillator output. Compensation input 1202 is adjusted using the relationship between the node and radio oscillators in combination with the radio oscillator frequency estimate. Comparator 1204 has comparator input 1205 and event output 1206. Counter 1203 increments upon receiving an edge from input 1201. This keeps time. Since counter 1203 is clocked by an uncompensated node oscillator, the estimate of elapsed time includes an error. This error is reduced by providing a signal to compensation input 1202; compensation input 1202 causes the counter 1203 to add one to its count (e.g., increment by 1), subtract one from its count (e.g., decrement by 1), or do nothing to its count (e.g., no increment or decrement) depending on input signal 1202. By periodically providing signals to compensation input 1202, the time indicated by counter 1203 becomes more accurate. For example, in some embodiments counter 1210 and relater output 1230 provide input to combination logic 1220, which provides compensation input 1202. Event output 1206 signals that the value in counter 1203 equals the value of comparator input 1205. In various embodiments, event output 1206 is used to trigger the node to wake up and perform some task; to trigger an interrupt service routine when the node incorporates a microprocessor; to first provide an adjustment to compensation input 1202 and then adjust input 1205 to schedule an subsequent adjustment to compensation input 1202; or for any other appropriate event scheduling. In some embodiments, comparator 1204, comparator input 1205, and event output 1206 are not included in timer 1200.

In some embodiments, timing calibration described above is used for applications other than mesh networking (e.g., point-to-point communication using periodic radio communication). In some embodiments, it is not necessary for the oscillator used to calibrate the node oscillator to be coupled to a radio transceiver, radio transmitter, or radio receiver. For example, a low-power clock that operates over an extended temperature range benefits from adding a second oscillator to help compensate the timekeeping oscillator. Other applications include three oscillators including a low-power crystal oscillator used for timekeeping, a second crystal oscillator used for compensating the low-power crystal oscillator, and a third oscillator distinct from the second oscillator used for providing a reference signal for a radio receiver, transmitter, or transceiver.

In some embodiments, it is not necessary for an actual radio transmitter, radio receiver, or radio transceiver to be present. When there is no radio, or when the oscillator used as a reference for the radio is not used for timing correction of the node oscillator, the term radio oscillator refers to a second oscillator with a quartz resonant element having a resonant frequency that would be appropriate for providing a frequency reference to a radio (e.g., generally above 1 MHz).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A device for timing events comprising:
    a first oscillator including an output, the first oscillator including a mechanically resonant element;
    a second oscillator including an output, the second oscillator including a quartz resonator, wherein the second oscillator has a temperature characteristic;
    a frequency relater having an output, a first input, and a second input, the frequency relater having the first input coupled to the first oscillator output and the second input coupled to the second oscillator output, wherein the output of the frequency relater provides a quantity corresponding to a frequency relation between a first oscillator frequency and a second oscillator frequency, and wherein an estimate of the first oscillator frequency is based at least in part on the first oscillator, the second oscillator, and the frequency relater; and
    a temperature measurement circuit having a temperature measurement output, wherein the temperature measurement output and the temperature characteristic of the second oscillator are used to improve the estimate of the first oscillator frequency.

2. The device as in claim 1, wherein the mechanically resonant element is one of the following: a quartz crystal, a micro-machined silicon resonator, a bulk-acoustic wave resonator, or a surface-acoustic wave resonator.

3. The device as in claim 1, wherein:
    the mechanically resonant element includes a quartz crystal having a resonance between 10 kHz and 100 kHz;
    and said second oscillator quartz resonator further comprising a resonance above 1 MHz.

4. The device as in claim 1, further including a non-volatile memory, said non-volatile memory storing at least one value representing frequency versus temperature curves of a typical said second oscillator.

5. The device as in claim 4, wherein said at least one value representing frequency versus temperature curves of the typical said second oscillator is selected from one or more of the following: a table of frequency and temperature values, a table of frequency error and temperature values, coefficients of a polynomial equation, a table of reciprocal frequency and temperature values, and a table of reciprocal frequency error values and temperature values.

6. The device as in claim 4, further including:
    a first calibration value, said first calibration value representing a measurement of a frequency of the second oscillator, said first calibration value stored in said non-volatile memory.

7. The device as in claim 4, further including:
    a first calibration value, said first calibration value representing a measurement of a first frequency of the second oscillator at a first temperature, said first calibration value stored in said nonvolatile memory;
    a second calibration value, said second calibration value representing a measurement of a second frequency of the second oscillator at a second temperature, said second calibration value stored in said nonvolatile memory.

8. The device as in claim 1, wherein said frequency relater further comprises:
    a first counter having an input connected to said first oscillator output and having an enable signal output, said enable signal output having a first state and a second state;
    a second counter having a first input and a second input, said first input connected to said enable signal output, said second input connected to said second oscillator output;
    wherein said first counter causes said enable signal to remain in said first state for a number of first oscillator output transitions before transitioning to said second state, and wherein said second counter counts transitions of the second input of the second counter when said enable signal output is in said first state.

9. The device as in claim 1, further comprising:
    a timer having an output, an oscillator input, and a compensation input, said timer oscillator input connected to said first oscillator output;
    wherein said timer compensation input is adjusted in response to said frequency relater output; and
    wherein said second oscillator oscillates at a second oscillator frequency.

10. The device as in claim 9, wherein said first oscillator includes a mechanically resonant element selected from the group consisting of: quartz crystal, micro-machined silicon resonator, bulk-acoustic wave resonator, surface-acoustic wave resonator.

11. The device as in claim 9, wherein said first oscillator includes a quartz crystal having a resonance between 10 kHz and 100 kHz and wherein said second oscillator frequency is above 1 MHz.

12. The device as in claim 9, wherein said frequency relater further comprises:
    a first counter having an input connected to said first oscillator output, and having an enable signal output, said enable signal output having a first state and a second state;
    a second counter having a first input and a second input, said first input connected to said enable signal output, said second input connected to said second oscillator output;
    wherein said first counter causes said enable signal to remain in said first state for a number of first oscillator output transitions before transitioning to said second state and said second counter counts transitions of said counter second input when said enable signal output is in said first state.

13. The device as in claim 9, wherein said timer further comprises:
a first counter having a value, said first counter connected to said timer oscillator input, said value changing upon transitions of said timer oscillator input;
a second counter having an output, said second counter connected to said timer oscillator input;
combinational logic having an output, a first input and a second input, said first input connected to said second counter output, said second input connected to said compensation input;
wherein said combinational logic output provides an adjustment to said first counter value.

14. The device as in claim 13, wherein said adjustment to said first counter value comprise one of the following: increment by 1, decrement by 1, or do nothing.

15. The device as in claim 9, further including:
a temperature measurement circuit having an output;
an adjustment device, said adjustment device having a first input connected to said temperature measurement circuit, a second input connected to said frequency relater, a first output connected to said timer compensation input, and a non-volatile memory, said non-volatile memory storing at least one value representing frequency versus temperature curves of a typical said second oscillator.

16. The device as in claim 15, wherein said adjustment device includes a microprocessor.

17. The device as in claim 15, wherein said at least one value representing frequency versus temperature curves of a typical said second oscillator comprises one of the following: a table of frequency and temperature values, a table of frequency error and temperature values, coefficients of a polynomial equation, a table of reciprocal frequency and temperature values, or a table of reciprocal frequency error values and temperature values.

18. The device as in claim 15, further including:
a first calibration value, said first calibration value representing a measurement of said second oscillator frequency, said first calibration value stored in said non-volatile memory.

19. The device as in claim 15, further including:
a first calibration value, said first calibration value representing a measurement of said second oscillator frequency at a first temperature, said first calibration value stored in said nonvolatile memory;
a second calibration value, said second calibration value representing a measurement of said second oscillator frequency at a second temperature, said second calibration value stored in said nonvolatile memory.

20. The device as in claim 19, wherein said first temperature is between 20° C. and 30° C. and said second temperature is between 70° C. and 100° C.

21. The device as in claim 1 wherein:
said first oscillator further comprises an adjustable load capacitance, and an output frequency;
said adjustable load capacitance is adjusted in response to said frequency relater output to maintain a more constant value of said first oscillator output frequency;
said mechanical resonant element comprises quartz.

22. The device as in claim 21, wherein said first oscillator quartz crystal has a resonance between 10 kHz and 100 kHz and said second oscillator quartz resonator has a resonance above 1 MHz.

23. The device as in claim 21, wherein said frequency relater further comprises:
a first counter having an input connected to said first oscillator output, and having an enable signal output, said enable signal having a first state and a second state;
a second counter having a first input and a second input, said first input connected to said enable signal output, said second input connected to said second oscillator output;
wherein said first counter causes said enable signal to remain in said first state for a number of first oscillator output transitions before transitioning to said second state and said second counter counts transitions of said counter second input when said enable signal output is in said first state.

24. The device as in claim 21 further including:
an adjustment device, said adjustment device having a first input connected to said temperature measurement circuit, a second input connected to said frequency relater, a first output connected to said adjustable load capacitance, and a non-volatile memory, said non-volatile memory storing at least one value representing frequency versus temperature curves of a typical said second oscillator.

25. The device as in claim 24, wherein said adjustment device includes a microprocessor.

26. The device as in claim 24, wherein said at least one value representing frequency versus temperature curves of a typical said second oscillator is selected from the group consisting of: a table of frequency and temperature values, a table of frequency error and temperature values, coefficients of a polynomial equation, a table of reciprocal frequency and temperature values, a table of reciprocal frequency error values and temperature values.

27. The device as in claim 24, further including:
a first calibration value, said first calibration value representing a measurement of said second oscillator frequency, said first calibration value stored in said non-volatile memory.

28. The device as in claim 24, further including:
a first calibration value, said first calibration value representing a measurement of said second oscillator frequency at a first temperature, said first calibration value stored in said non-volatile memory;
a second calibration value, said second calibration value representing a measurement of said second oscillator frequency at a second temperature, said second calibration value stored in said non-volatile memory.

29. The device as in claim 28, wherein said first temperature is between 20° C. and 30° C. and said second temperature is between 70° C. and 100° C.

30. A method for calibrating a wireless mesh network node comprising:
determining a node temperature;
determining a frequency of a radio oscillator at the node temperature, wherein the radio oscillator comprises a quartz resonator;
relating the frequency of the radio oscillator to a node oscillator frequency by either counting a first number of radio oscillator cycles in a first number of node oscillator cycles or by counting a second number of node oscillator cycles in a second number of radio oscillator cycles, wherein the node oscillator includes a mechanically resonant element; and adjusting the node based at least in part on the node temperature, the frequency of the radio oscillator, and a radio oscillator temperature calibration.

31. The method as in claim 30, wherein adjusting the node comprises adjusting the node oscillator frequency.

32. The method as in claim 30, wherein adjusting the node comprises adjusting a count in a node timer.

* * * * *